(12) United States Patent
Watanabe et al.

(10) Patent No.: US 6,337,821 B1
(45) Date of Patent: *Jan. 8, 2002

(54) DYNAMIC RANDOM ACCESS MEMORY HAVING CONTINUOUS DATA LINE EQUALIZATION EXCEPT AT ADDRESS TRANSLATION DURING DATA READING

(75) Inventors: Yohji Watanabe; Kenji Tsuchida, both of Kawasaki (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/636,504

(22) Filed: Aug. 10, 2000

Related U.S. Application Data (63) Continuation of application No. 08/150,782, filed on Nov. 12, 1993, now Pat. No. 6,108,254, which is a continuation of application No. 07/709,873, filed on Jun. 4, 1991, now abandoned.

(30) Foreign Application Priority Data

Jun. 4, 1990 (JP) .............................................. 2-144442

(51) Int. Cl.[7] .......................... G11C 7/06; G11C 11/407
(52) U.S. Cl. ...................... 365/202; 365/203; 365/205; 365/207; 365/233.5
(58) Field of Search ................................ 365/202, 203, 365/205, 207, 233.5

(56) References Cited

U.S. PATENT DOCUMENTS

| | | | | |
|---|---|---|---|---|
| 4,616,342 A | * | 10/1986 | Miyamoto | 365/189.05 |
| 4,811,295 A | * | 3/1989 | Shinoda | 365/189.05 |
| 4,870,617 A | | 9/1989 | Nakano et al. | |
| 4,881,203 A | * | 11/1989 | Watanabe et al. | 365/203 |
| 4,891,792 A | * | 1/1990 | Hanamura et al. | 365/189.05 |
| 4,894,803 A | * | 1/1990 | Aizaki | 365/189.05 |
| 4,922,461 A | * | 5/1990 | Hayakawa et al. | 365/230.08 |
| 5,146,427 A | * | 9/1992 | Sasaki et al. | 365/189.05 |

FOREIGN PATENT DOCUMENTS

| | | |
|---|---|---|
| EP | 0154 314 | 9/1985 |
| EP | 0281 889 | 9/1988 |
| JP | 60-119698 | 6/1985 |
| JP | 63-007591 | 1/1988 |

OTHER PUBLICATIONS

ISSCC 84/Thursday, Feb. 23, 1984/Continental Ballrooms 5–9/3:45 P.M.; Session XV: Static RAMs; Osamu Minato et al; 1984 IEEE International Solid–State Circuits Conference; pp. 222–223.

* cited by examiner

Primary Examiner—Jack A. Lane
(74) Attorney, Agent, or Firm—Oblon, Spivak, McClelland, Maier & Neustadt, P.C.

(57) ABSTRACT

A data input/output buffer is connected between first data lines and second data lines. An equalizing circuit and a data latch circuit are connected to the second data lines. The equalizing circuit maintains the second data lines in reset condition, during normal operation. It temporarily releases the second data lines from the reset condition, in response to an output from an address-transition detecting circuit, thereby to transfer the data from the data input/output buffer. The data latch circuit latches the data transferred to the second data lines, in response to the output from the address-transition detecting circuit.

12 Claims, 9 Drawing Sheets

DYNAMIC RANDOM ACCESS MEMORY HAVING CONTINUOUS DATA LINE EQUALIZATION EXCEPT AT ADDRESS TRANSLATION DURING DATA READING

This application is a continuation of Ser. No. 08/150,782 filed Nov. 12, 1993, U.S. Pat. No. 6,108,254 which is a continuation of Ser. No. 07/709,873 filed Jun. 4, 1993 abandoned.

BACKGROUND OF THE INVENTION

1. Field of the Invention

The present invention relates to a dynamic random access memory (DRAM) which has synchronous data transfer means.

2. Description of the Related Art

Two of the important points in designing a large-scale integrated circuit (LSI) are an increase in the operating speed at which the LSI operates, and a reduction in the power the LSI consumes. The hither the integration density of the LSI, the greater the capacitance and resistance of the data lines which connects the circuit blocks of the LSI. When the LSI data lines have a great capacitance and a high resistance, the performance of the LSI decreases. To set the LSI performance at a sufficiently great value despite of the great capacitance and high resistance of the data lines, a data transfer control system is used. This system comprises a differential amplifier connected between an input data line and an output data line of the LSI, and an equalizing circuit connected to the output terminal of the differential amplifier. First, the equalizing circuit resets the data on the output data line. Then, the data is transferred from the input data line to the output data line.

The data transfer control system described above makes it possible to transfer data at high speed, even if the data lines, in particular the output data lines, have a large capacitance or a high resistance. The reason why will be explained briefly. If new data is transferred from the input data line from the output data line, with the old data remaining on the data output line, the differential amplifier needs to drive the output data line, thereby to invert the old data and form new data. In order to perform this task, the amplifier must have a great drivability. Hence, if the output data line has a great capacitance or a high resistance, data cannot be transferred at high speed. In the data transfer control system, data can be transferred at high speed even if the differential amplifier has no great drivability, since the equalizing circuit resets the output data line prior to the data transfer.

Even if the data transfer control system is used, however, the transfer of the new data is delayed if it takes a long time to equalize the output data line. The delay in transferring the new data is a bar to high-speed operation and makes a great problem to a recently developed large-chip LSI, in particular a DRAM comprising data lines which are thin and long and, hence, have a great capacitance or a high resistance. To be more specific, the operating speed of the I/O data buffer incorporated in a DRAM, for transferring data to, and receiving data from, external devices, is very important.

As has been described, in the great problem with the I/O data buffer used in the conventional large-scale DRAM, it takes a long time to equalize the data lines, inevitably reducing the speed of data transfer.

SUMMARY OF THE INVENTION

The object of the invention is to provide a DRAM having means which can transfer data at a sufficiently high speed.

To accomplish this object, a DRAM according to the present invention comprises:

- a memory-cell array having a plurality of parallel bit lines, a plurality of parallel word lines intersecting with the bit lines, and a plurality of dynamic memory cells located at intersections of the bit lines and the word lines;
- a sense amplifier for supplying data to and receiving data from any selected one of the memory cells;
- an address buffer having an output terminal and designed to store a row address and a column address externally supplied;
- a column decoder located near the memory-cell array, for selecting one of the bit lines in accordance with the column address output from the address buffer;
- a row decoder located near the memory-cell array, for selecting one of the word lines in accordance with the row address output from the address buffer;
- a transfer gate selectively controlled by said column decoder;
  first data lines connected to the bit lines by the transfer gate;
  a data input/output buffer connected to the first data lines;
  second data lines connected to the first data lines by the data input/output buffer;
  an address-transition detecting circuit connected to the output terminal of the address buffer, for detecting transition of the row and column address signals output from the address buffer and for outputting a signal upon detecting the transition of the row and column address signals;
  an equalizing circuit connected to the second data lines, for maintaining the second data lines in reset condition during normal operation, and for temporarily releasing the second data lines from the reset condition in response to the signal output from the address-transition detecting circuit; and
  a data-latching circuit connected to the second data lines, for latching data transferred to the second data lines, in response to the signal output from the address-transition detecting circuit.

In the DRAM of the invention, the second data lines remain in the reset (equalized) condition until address transition occurs at the output of the address buffer. When address transition occurs, the second data lines are released from the reset condition, whereby data is transferred from the first data lines to the second data lines almost at the same time the address transition takes place. The data transferred to the second data lines is latched by the data-latching circuit. The second data lines are therefore made ready for receiving the data which will be transferred from the first data lines when address transition occurs. No time is therefore required to equalize either data lines, unlike in the conventional data transfer control system. Hence, data can be transferred at high speed in the DRAM according to the present invention.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

The basic structure of the data transfer circuit incorporated in a DRAM according to the invention will now be described in detail, with reference to FIG. 1.

Figure 1:
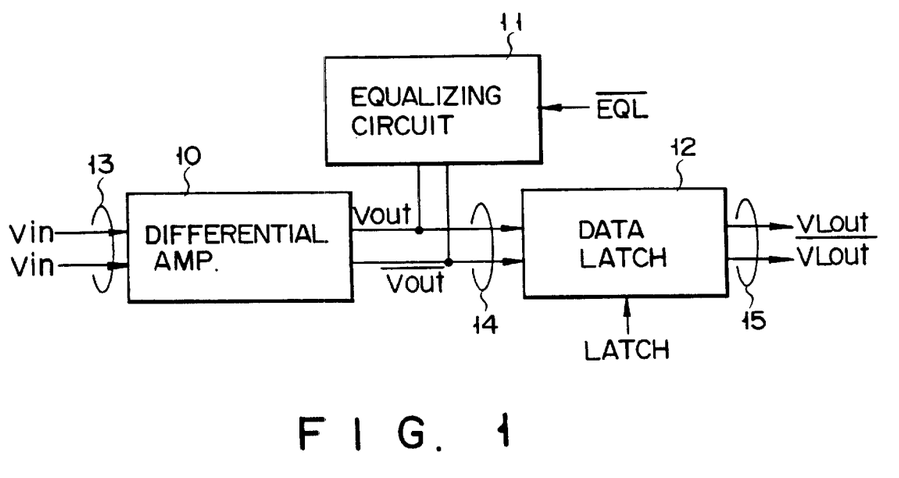
FIG. 1 is a block diagram schematically showing a data transfer circuit for use in a DRAM according to the present invention.

As is shown in FIG. 1, the data transfer circuit comprises a differential amplifier circuit 10, an equalizing circuit 11, a data latch circuit 12, a pair of first data lines 13, a pair of second data lines 14, and a pair of data output lines 15. The first data lines 13 are connected to the input of the differential amplifier 10 which is the main component of the data transfer circuit. The second data lines 14 are connected at one end to the output of the amplifier 10, and at the other end to the input of the data latch circuit 12. The equalizing circuit 11 is connected to the second data lines 14. The equalizing circuit 11 is controlled by a control signal $\overline{EQL}$ which has been generated when the data on the first data lines 13 undergo transition. The data output lines 15 are connected to the output of the data latch circuit 12. The data latch circuit 12 is controlled by a control signal LATCH which has been generated when the data on the first lines 13 undergo transition.

Figure 6:
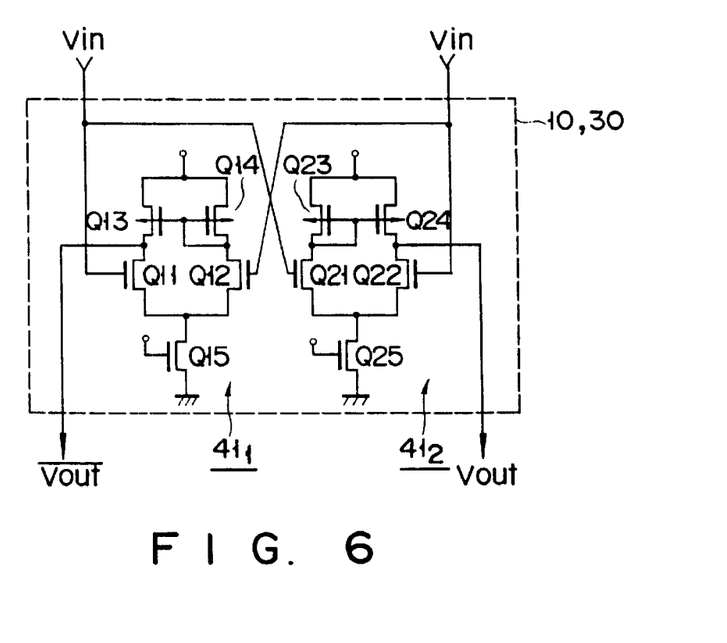
FIG. 6 is a circuit diagram showing a CMOS differential amplifier circuit used in a read mode as the data transfer circuit.

The differential amplifier 10 when used to read out data from the memory 27 is, for example, of the type shown in FIG. 6. The amplifier 10 comprises two CMOS differential amplifiers $41_1$ and $41_2$, both being of current-mirror type. The first CMOS differential amplifier $41_1$ is comprised of three n-channel MOS transistors Q11, Q12 and Q15 and two p-channel MOS transistors Q13 and Q14. The sources of the n-channel MOS transistors Q11 and Q12 are connected together. The p-channel MOS transistors Q13 and Q14 are current-supplying elements, and have their drains connected to the drains of the n-channel MOS transistors Q11 and Q12, respectively. The n-channel MOS transistor Q15 is connected to the source node of the n-channel MOS transistors Q11 and Q12. The second CMOS differential amplifier $41_2$ is also comprised of three n-channel MOS transistors Q21, Q22 and Q25 and two p-channel MOS transistors Q23 and Q24 which are connected in the same way as their equivalents of the first CMOS differential amplifier $41_1$.

The differential amplifier shown in FIG. 6 is an asynchronous one, and immediately amplifies and output the transition of the input data. It can be replaced by a synchronous differential amplifier comprising flip-flops.

Figure 7:
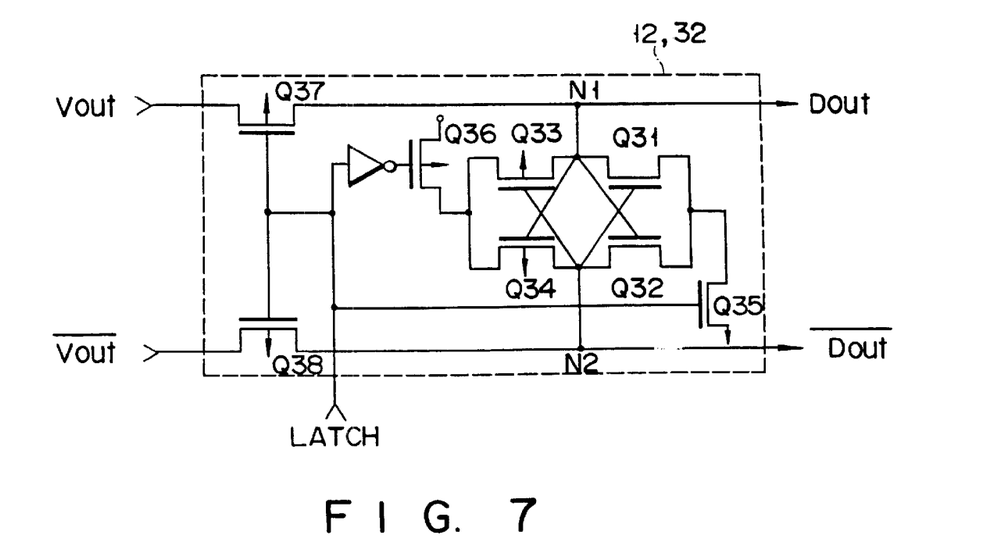
FIG. 7 is a circuit diagram illustrating a CMOS latch circuit used in a read mode as the data transfer circuit.

The data latch circuit 12 when used to read out data, is, for example of the type illustrated in FIG. 7, which has a CMOS flip-flop and which has applied thereto the outputs Vout, $\overline{Vout}$ of FIG. 6. The data latch circuit shown in FIG. 7 comprises a pair of three n-channel MOS transistors Q31, Q32 and Q35 and five p-channel MOS transistors Q33, Q34, Q36, Q37 and Q38. The MOS transistors Q31, Q32, Q33 and Q34 constitute a flip-flop. The MOS transistors Q35 and Q36 are used to activate the flip-flop. The MOS transistors Q37 and Q38 are latch control elements. In operation, the p-channel MOS transistors Q37 and Q38 are turned on when the latch control signal LATCH falls to a low level, whereby the input data is transferred to the nodes N1 and N2 of the flip-flop. When the control signal LATCH rises to a high level, the transistors Q37 and Q38 are turned off, whereby the nodes N1 and N2 are disconnected from the input lines, and the flip-flop is activated at the same to hold the data.

Figure 8:
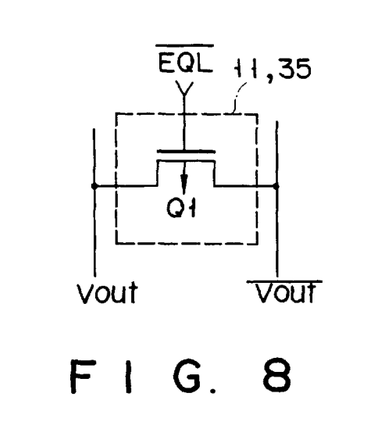
FIGS. 8 to 10 are circuit diagrams showing various equalizing circuits for use in the DRAM according to the present invention.
Figure 9:
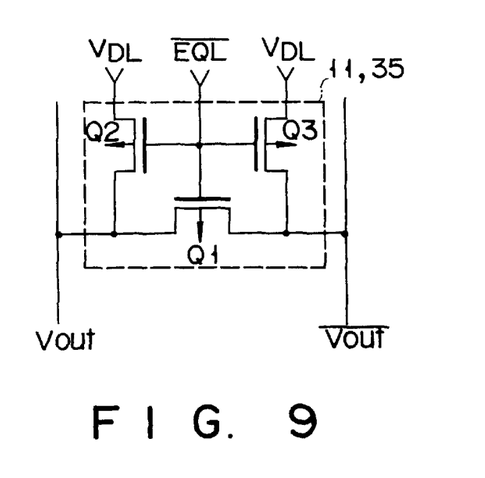
Figure 10:
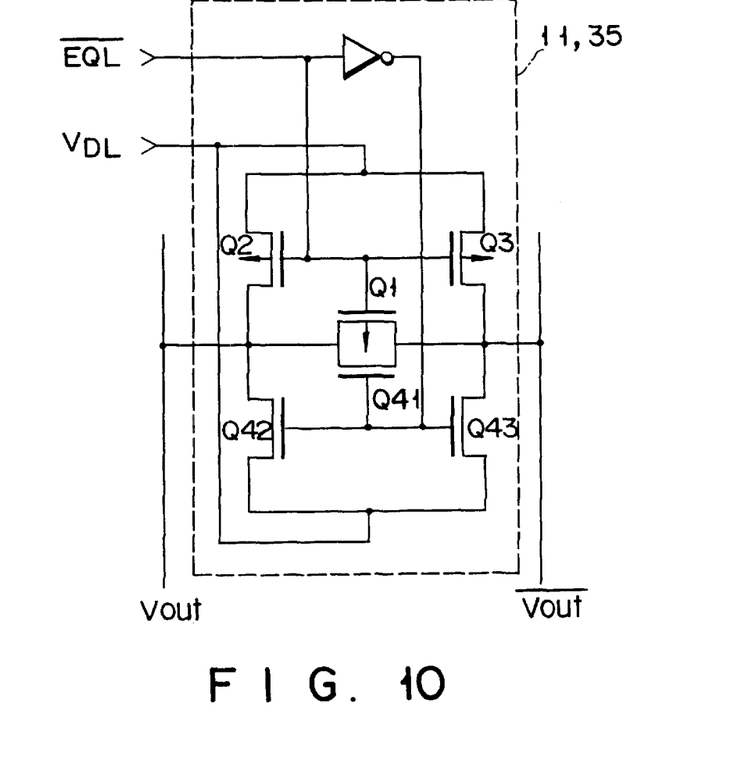

The equalizing circuit 11 is one selected from those illustrated in FIGS. 8 to 10. The equalizing circuits shown in FIGS. 8 to 10 will be described, one by one.

The equalizing circuit shown in FIG. 8 comprises a p-channel MOS transistor Q1, the gate of which is connected to receive the equalizing control signal $\overline{EQL}$. When the control signal $\overline{EQL}$ falls to the low level, the MOS transistor is turned on, thus connecting two signal lines Vout and $\overline{Vout}$.

The equalizing circuit illustrated in FIG. 9 comprises an p-channel MOS transistor Q1 for connecting signal lines Vout and $\overline{Vout}$, and two p-channel MOS transistors Q2 and Q3 for precharging the signal lines Vout and $\overline{Vout}$. The gate of the MOS transistor Q1 is connected to receive the control signal $\overline{EQL}$. When the control signal $\overline{EQL}$ falls to the low level, all MOS transistors Q1, Q2 and Q3 are turned on. As a result of this, both signal lines vout and $\overline{Vout}$ are short-circuited and are precharged to a potential $V_{DL}$. The precharge potential $V_{DL}$ is, for example, ½ Vcc; it can take any other suitable value.

The equalizing circuit of FIG. 10 comprises two equalizing circuits which are identical to the circuit of FIG. 9, each comprising three p-channel MOS transistors Q1 to Q3. This performs the same function as the equalizing circuit shown in FIG. 9, and is superior thereto in terms of switching characteristic. The p-channel MOS transistors can be replaced by n-channel MOS transistors.

Figure 2:
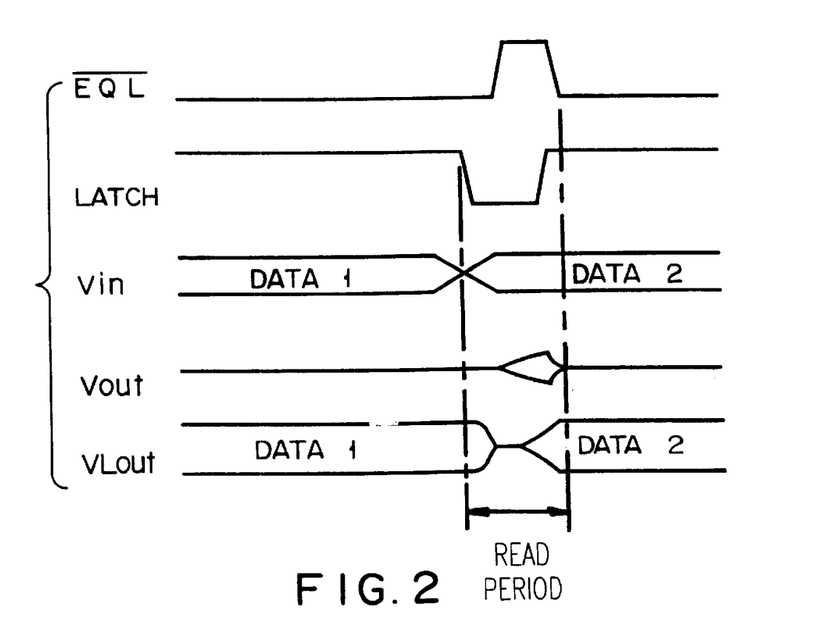
FIG. 2 is a timing chart explaining the operation of the data transfer circuit shown in FIG. 1.

The operation of the data transfer circuit shown in FIG. 1 will now be explained, with reference to the timing chart of FIG. 2.

As long as the input data remains unchanged, the control signal $\overline{EQL}$ is at the low level. Controlled by this signal, the equalizing circuit 11 short-circuits the second data lines 14. The second data lines 14 are thereby precharged to, for example, a potential of ½ Vcc. In other words, the lines 14 are reset or equalized. On the other hand, as long as the input data remains unchanged, the control signal LATCH is at the high level, and the data (i.e., old data) input to the data transfer circuit in the previous operation cycle is kept latched in the data latch circuit 12.

The moment the input data on the first data lines 13 undergoes transition, changing from Data 1 to Data 2, the signal LATCH controlling the data latch circuit 12 falls to the low level, thus releasing the old data and beginning a read period. Almost at the same time, the signal $\overline{EQL}$ controlling the equalizing circuit 11 rises to the high level, releasing the second data lines 14. Hence, Data 2, is transferred from the first data lines 13 to the second data lines 14 through the differential amplifier 10. When the difference between the potentials on the second data lines 14 increases to a predetermined value, the control signal LATCH rises to the high level, whereby Data 2 is latched in the data latch circuit 12. The control signal $\overline{EQL}$ falls back to the low level immediately thereafter, The second data lines 14 are thereby reset again, thus ending the reading perod. As a result, the data on the output lines 15 changes, from the old data (i.e., Data 1) to the new one (i.e., Data 2).

When the next data is input to the data transfer circuit, the operations described in the preceding paragraph are repeated in sequence, thereby transferring the data from the first signal lines 13 to the output lines 15 through the differential amplifier 10, the second data lines 14, and the latch circuit 12.

As can be understood from the above, virtually no time is required to equalize the second data lines 14, unlike in the conventional data transfer circuit. In other words, the data is transferred, almost at the same time the input data undergoes transition. Thus, even if the second data lines 14 are considerably long, and hence have a great capacitance and a high resistance, data can be transferred at high speed.

A DRAM according to the invention, which includes Aa data transfer circuit, will now be described with reference to FIG. 3.

Figure 3:
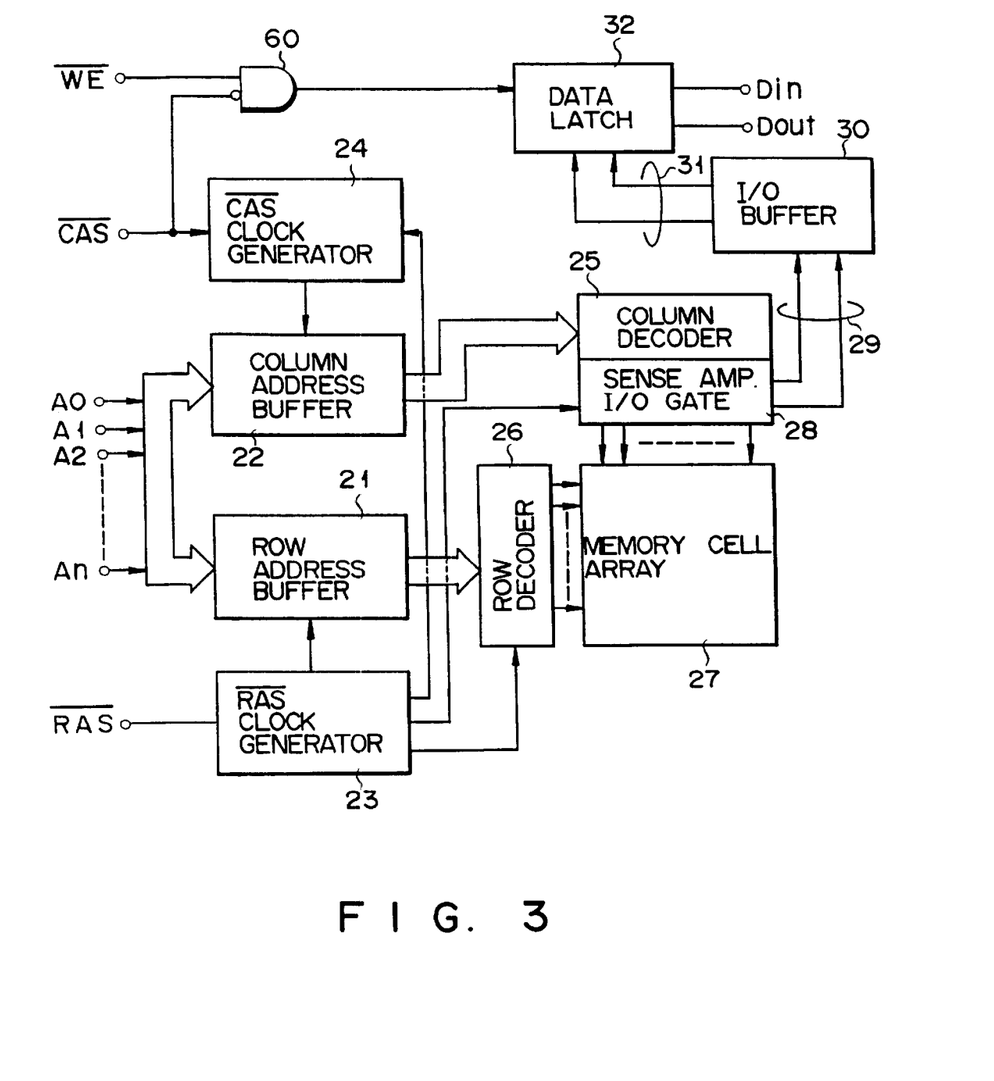
FIG. 3 is a block diagram illustrating the DRAM according to a first embodiment of the invention.

As is evident from FIG. 3, the DRAM comprises a row address buffer 21, a column address buffer 22, a $\overline{RAS}$ clock generator 23, a $\overline{CAS}$ clock generator 24, a column decoder 25, a row decoder 26, a memory cell array 27, a sense amplifier 28, first data lines 29, a data input/output buffer 30, second data lines 31, and a data latch circuit 32.

The row address buffer 21 and the column address buffer 22 are connected to receive a row address and a column address, respectively, which have been externally supplied. The $\overline{RAS}$ clock generator 23 generates a clock signal for controlling the row address buffer. The $\overline{CAS}$ clock generator 24 generates a clock signal for controlling the column address buffer 22. The column decoder 25 decodes the column address held in the buffer 22, thereby to select some of the bit lines of the cell array 27. The row decoder 26 decodes the row address held in the buffer 21, thereby to select some of the word lines of the cell array 27. The memory cell array 27 has memory cells arranged in rows and columns at the intersections of the bit lines and the word lines. Each of these memory cells consists of one transistor and one capacitor. The sense amplifier 28 supplies data to the memory cell array 27 and receive data therefrom. The first data lines 29 are connected to the bit lines selected in accordance with the column address decoded by the decoder 22. The data input/output buffer 30 is connected to the first data lines 29. The second data lines 31 are connected between the output of the buffer 30 and the input of the data latch circuit 32.

The DRAM further comprises a substrate-biasing circuit (not shown) and a refresh counter (not shown, either) for achieving self-refreshing of the memory cell array 27. The DRAM is not different from the conventional one, as far as its structure described above is concerned. If necessary, the DRAM can have a serial address counter which generates a serial column address for designating several bit lines, thereby to achieve a serial access to the memory cell array 27.

Figure 4:
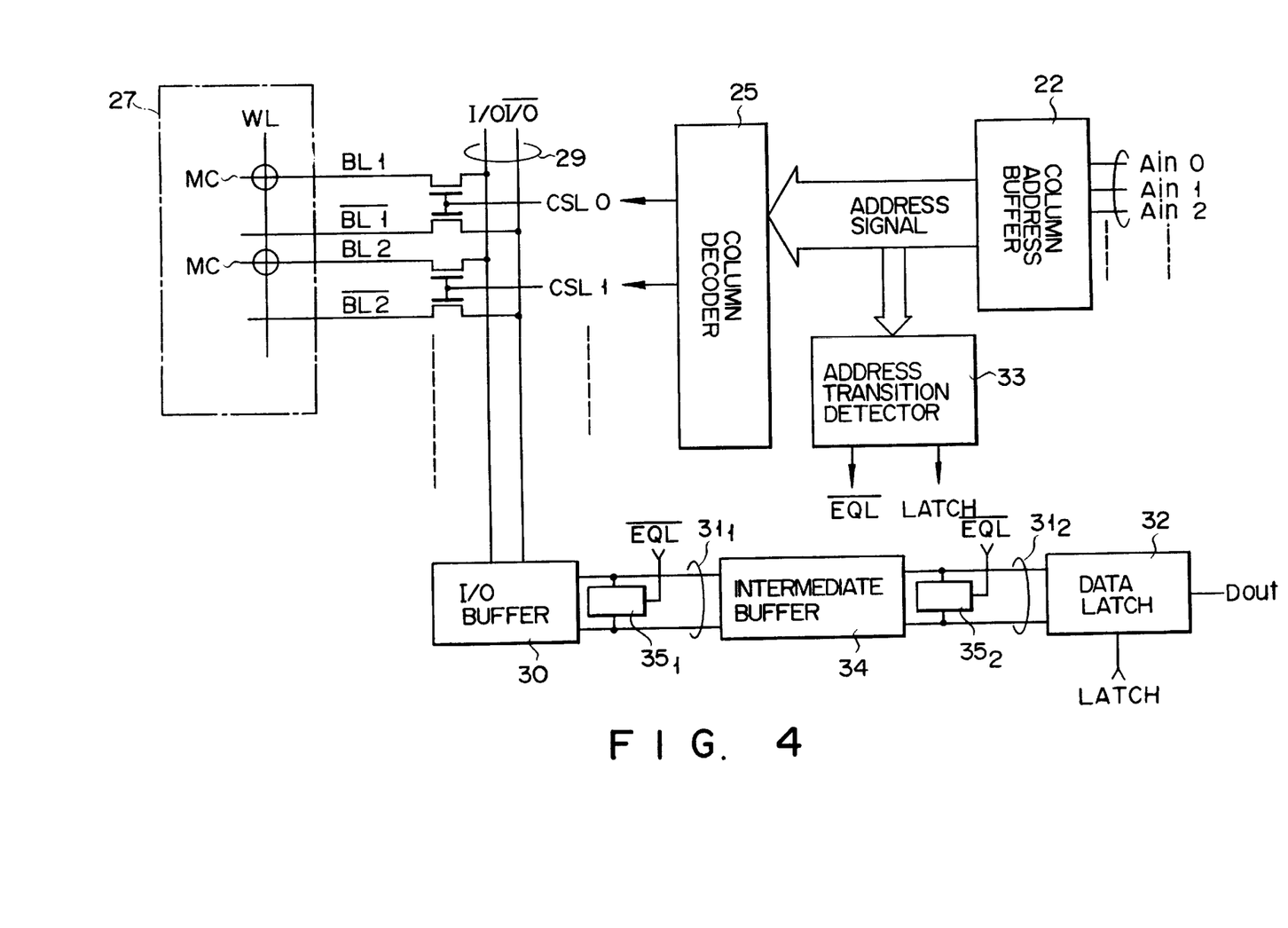
FIG. 4 is a diagram showing the main part of the DRAM illustrated in FIG. 3.

FIG. 4 illustrates the data transfer system incorporated in the DRAM shown in FIG. 3. As this figure shows, the memory cell array 27 has pairs of bit lines BL and $\overline{BL}$ and word lines WL intersecting with the bit lines BL and $\overline{BL}$. The memory cells MC are arranged at the intersections of the bit-line pairs and the word lines WL. The bit lines BL and $\overline{BL}$ of each pair are selectively connected to the first data lines 29 by a transfer gate which is controlled by column select signals CSL on column-select signal lines $CSL_0$, $CSL_1$, ..., which have been output from the column decoder 25.

Although not shown in FIG. 4, the second data lines 31 connecting the data input/output buffer 30 and the data latch circuit 32 each consist of two data lines $31_1$ and $31_2$. An intermediate buffer 34 is connected between the data lines $31_1$ and the data lines $31_2$ corresponding to the second data lines 31. An equalizing circuit $35_1$ is connected to the lines $31_1$, and an equalizing circuit $35_2$ is connected to the lines $31_2$. The use of the intermediate buffer 34 is safe-guard against the case where the load capacitance of the input/output buffer 30 surpasses the drivability of the buffer 30. Hence, the intermediate buffer 34 can be dispensed with, if the buffer 30 has drivability sufficiently great for the load capacitance. If the drivability of the buffer 30 is far from sufficient, the second data lines 31 must be divided into three or more parts, and two or more intermediate buffers must be used.

The output of the column address buffer 22 is connected to an address-transition detecting circuit 33. The circuit 33 generates a control signal $\overline{EQL}$ and a control signal LATCH upon detecting a transition of the address. The signal $\overline{EQL}$ will control the equalizing circuit 35, and the signal LATCH will control the data latch circuit 32.

The input/output buffer 30, which transfers data from the first data lines 29 to the second data lines 31, is the CMOS differential amplifier circuit of current mirror type, which is illustrated in FIG. 6. The intermediate buffer 34 can be also a differential amplifier circuit of current mirror type. The data latch circuit 32 is the CMOS latch circuit shown in FIG. 7. The equalizing circuit 35 can be one of the circuits illustrated in FIGS. 8 to 11.

Figure 5:
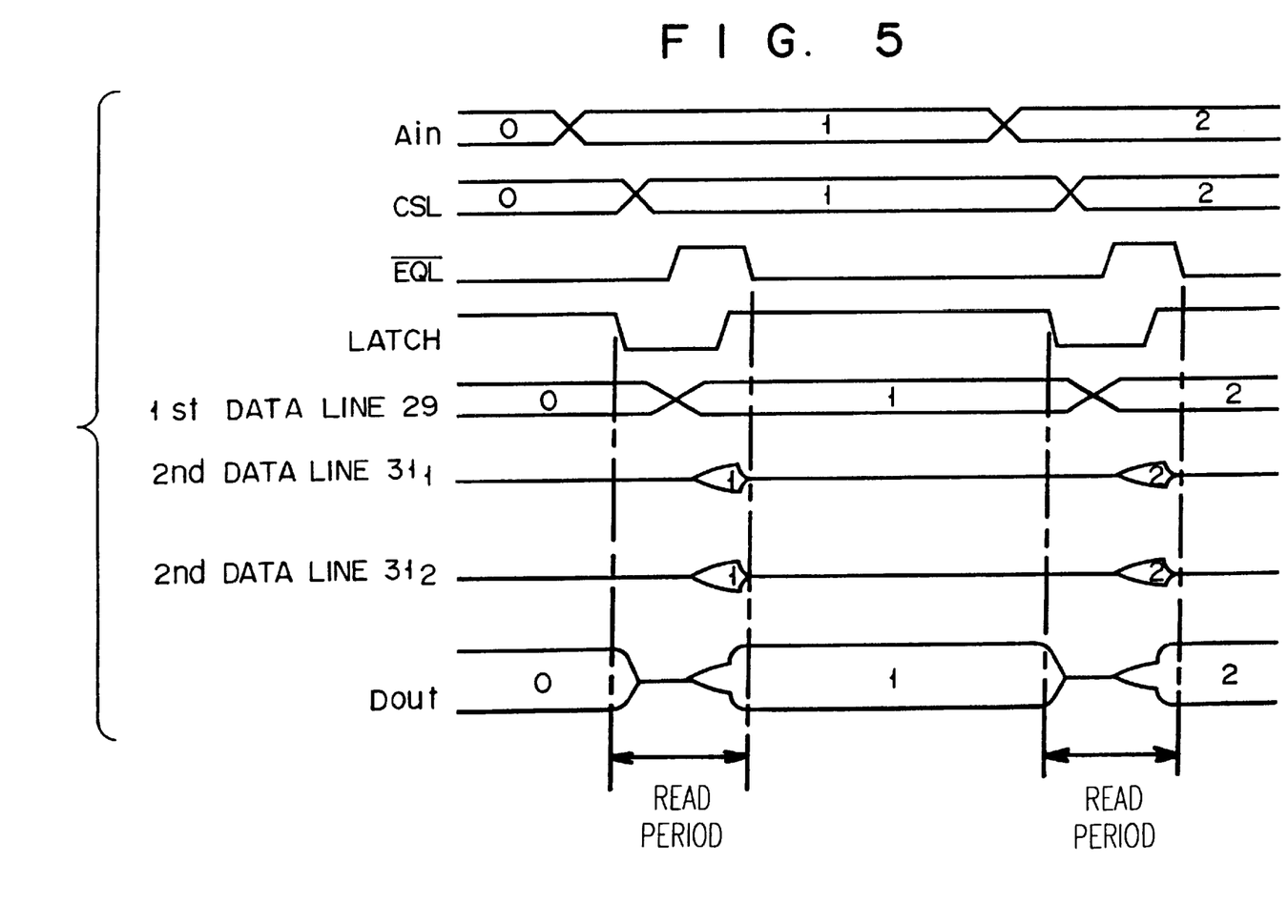
FIG. 5 is a timing chart explaining the operation of the DRAM shown in FIG. 3.

With reference to the timing chart of FIG. 5, it will be explained how the columns of memory cells MC are selected in order to read data from the DRAM shown in FIG. 3.

First, address data is externally input to the DRAM chip and then to the column address buffer 22. The column address decoder 25 decodes the address data stored in the buffer 22, whereby one of the column-select signal lines CSL is set at the high level. The data on the selected pair of bit lines BL and $\overline{BL}$ of the memory cell array 27 is thereby transferred to the first data lines 29 through the transfer gate. The data on the first data lines 29 is transferred to the second data lines 31 through the input/output buffer 30, and is then latched in the data latch circuit 32.

After the data has been latched in the latch circuit 32, the control signals $\overline{EQL}$ and LATCH, both supplied from the address transition detector 33, remain at the low level and the high level, respectively, until the detector 33 detects the next transition in the address data. Controlled by the signal $\overline{EQL}$ at the low level, the equalizing circuit 35 precharges the second data lines 31 to a potential of, for example, ½ Vcc, or keeps these lines 31 in equalized condition. Controlled by the signal LATCH at the high level, the data latch circuit 32 continues to hold the old data.

When the next address data is input to the column address buffer 22, the column decoder 26 selects one of the column-select signal lines CSL. The column select signal on the column-select signal line CSL selected rises to the high level. The data on the pair of bit lines BL and $\overline{BL}$ connected to selected column-select line CSL is thereby transferred to the first data lines 29. This data is immediately transferred to the second data lines 31 through the input-output buffer 30, is then further transferred through the intermediate buffer 34 to the data latch circuit 32, and is latched in the data latch circuit 32. As a result, the data latch circuit 32 latches the new data, instead of the old data.

Thereafter, the latch control signal LATCH rises back to the high level, and then the equalizing control signal $\overline{EQL}$ falls back to the low level. The data latch circuit 32 is thereby electrically disconnected from the second data lines 31. The second data lines 31 are equalized again by means of the equalizing circuit 35. These lines 31 remains equalized up until transition occurs in the address data.

As can be understood from the above, in the DRAM of FIG. 3, virtually no time is wasted to transfer the data, which has been read from the memory cell array 27, to the data latch circuit 32 after transition occurs in the address data. This ensures high-speed access to the memory cell array 27.

Figure 14:
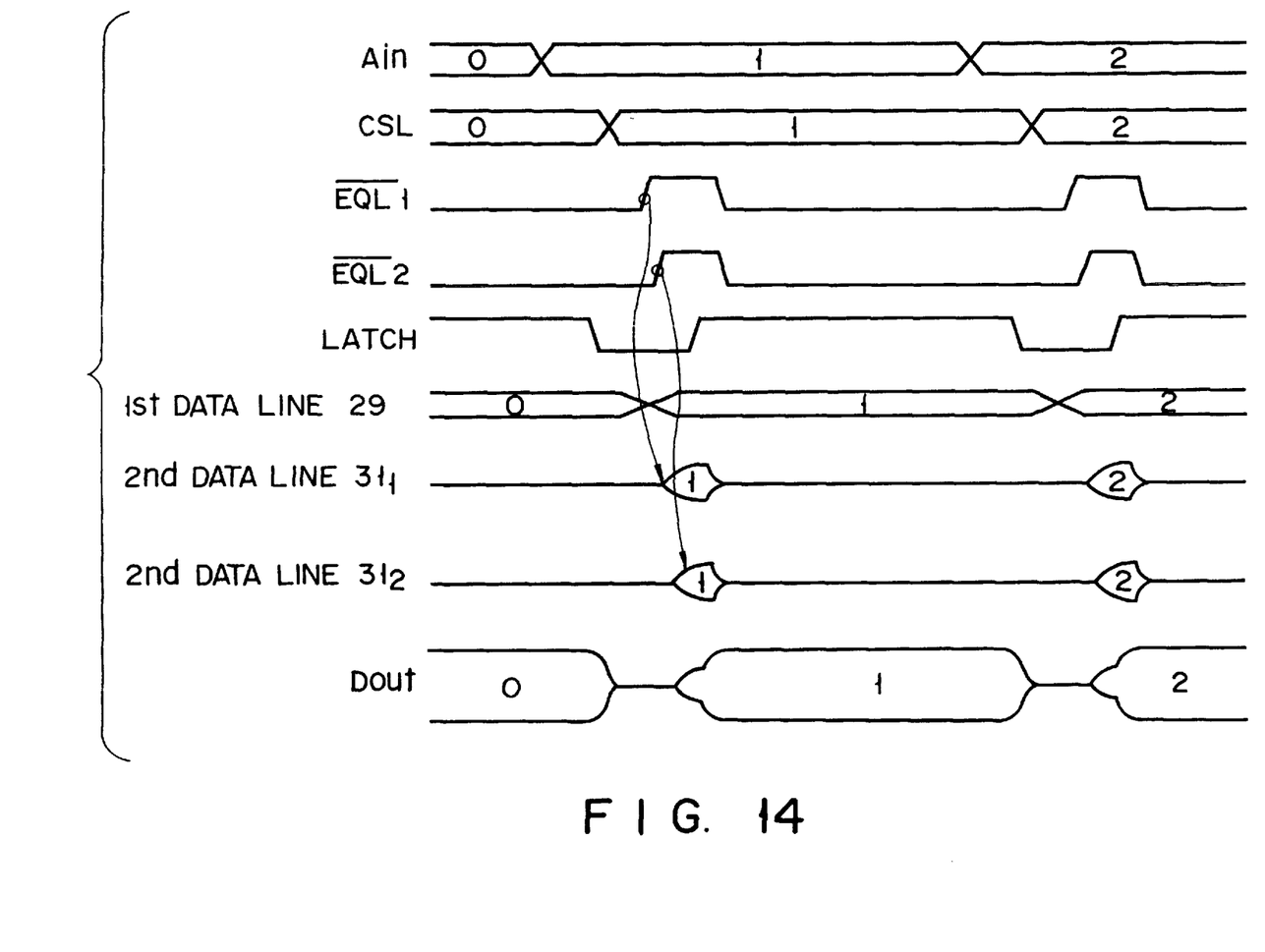
FIG. 14 is a timing chart explaining the operation of the DRAM shown in FIG. 13.

The data transfer section of the DRAM described above has the intermediate buffer 34, and the data lines $31_1$ connected to the input of this buffer 34 and the data lines $31_2$ connected to the output of the buffer 34 are equalized and de-equalized in accordance with a single clock signal $\overline{EQL}$. In order to achieve more stable transfer of data, two control clock signals $\overline{EQL_1}$ and $\overline{EQL_2}$ can be supplied to equalizing circuits $35_1$ and $35_2$, respectively, so that the circuit $35_2$ can de-equalize the data lines $31_2$ after the equalizing circuit $35_1$ has de-equalized the data lines $31_1$. In this case, as is evident from the timing chart of FIG. 14, the signal $\overline{EQL_1}$ de-equalizes the data lines $31_i$ when the address undergoes transition, whereby data is transferred through the lines $31_1$, and the signal $\overline{EQL_2}$ de-equalizes the data lines $31_2$ after the signal on the line $31_1$ has been amplified to some extent, whereby the data is transferred through the lines $31_2$. The data lines $31_1$ and the data lines 312 can be equalized again, substantially at the same time, by applying the signals $\overline{EQL_1}$ and $\overline{EQL_2}$ to the circuits $35_1$ and $35_2$ almost simultaneously. Thus, the intermediate buffer 34 can output data some time after it has received the data. This ensures a stable data transfer.

Figure 11:
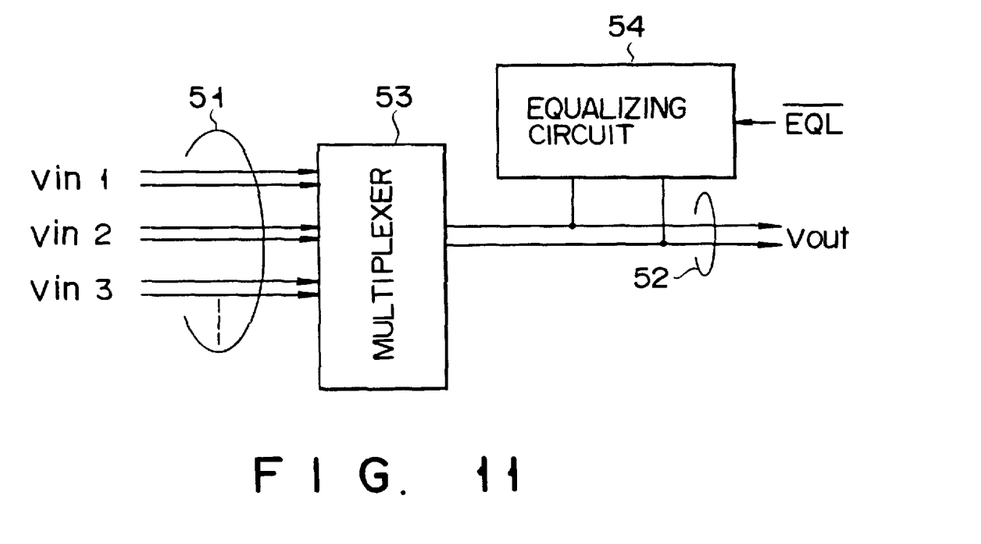
FIG. 11 is a block diagram showing a combination of a multiplexer and a data transfer circuit of the invention.

The present invention is not limited to the embodiments described above, which have a differential amplifier circuit used as data transfer circuit. Rather, it can be applied to a multiplexer used as data transfer circuit. More specifically, as is shown in FIG. 11, pairs of first data lines 51 are connected to the input of a multiplexer 53, and a pair of second data lines 52 are connected to the output of the multiplexer 53. The multiplexer 53 selects one pair of first data lines 51, whereby the data on the first data lines 51 thus selected is supplied through the second data lines 52. An equalizing circuit 54, which performs the same function as its counterpart of the above-described embodiments, is connected to the second data lines 52, and a data latch circuit (not shown) is connected to the second data lines 52.

Figure 12:
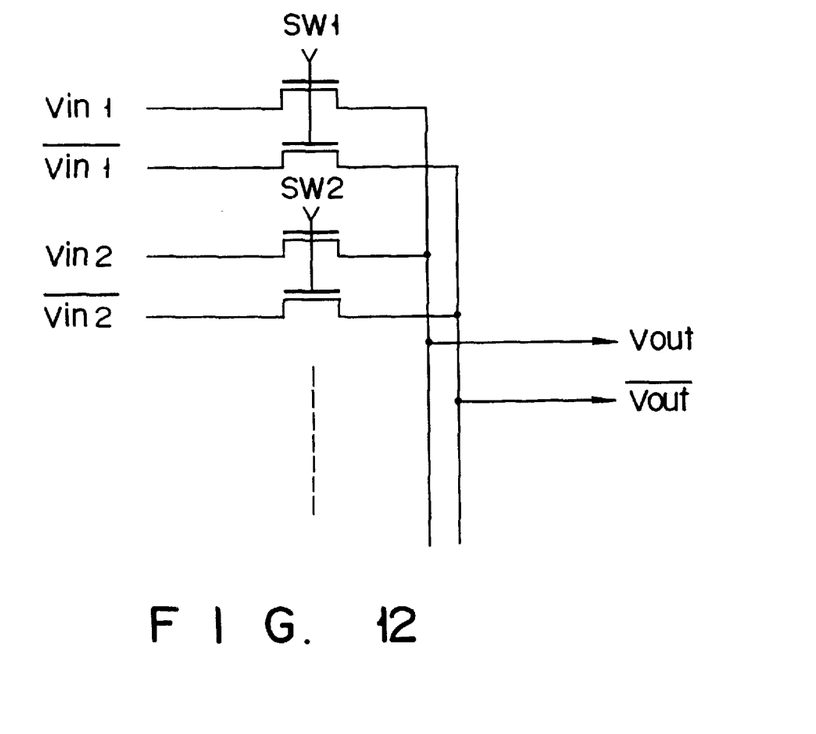
FIG. 12 is a circuit diagram illustrating the multiplexer shown in FIG. 11.
Figure 13:
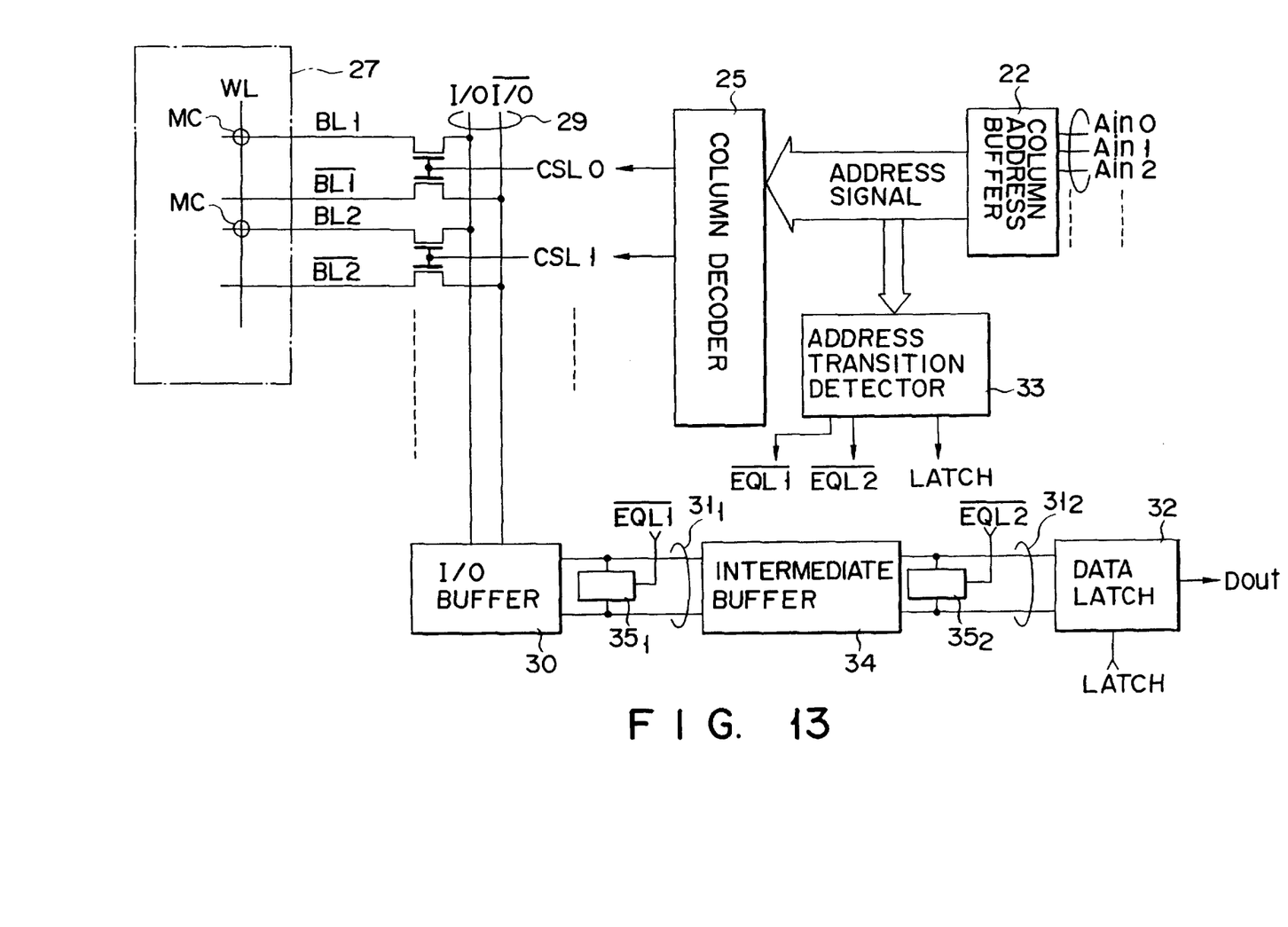
FIG. 13 is a block diagram illustrating the DRAM according to a second embodiment of the invention.

FIG. 12 shows the most simple example of the multiplexer 53. As is evident from FIG. 12, this multiplexer comprises transfer gate transistors.

Also in the embodiment shown in FIG. 11, data can be transferred at high speed even in the case where the second data lines 52 have a great capacitance and a high resistance.

As has been described above, the present invention can provide a DRAM, wherein no waiting time is required to equalize the data lines for transferring data, by virtue of internal synchronizing control, and data can be transferred through the data lines at high speed. The DRAM of the invention can therefore be accessed at high speed even if it has a large chip size and its data lines have a great capacitance and a high resistance.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A data transfer control circuit comprising:
    a data transfer circuit selectively connecting a plurality of first data lines to a second data line to transfer data input to said first data lines to said second data line;
    an equalizer circuit arranged on said second data line and configured to maintain said second data line at a reset state in a stable condition and temporarily release the reset state of said second data line in synchronism with transition of data input from said first data lines; and
    a data latch circuit arranged on said second data line and configured to latch a data signal transferred through said data transfer circuit in synchronism with transition of data from said first data lines, and wherein
    said data transfer circuit comprises a multiplexer circuit configured to extract data of a data line selected from said plurality of first data lines to said second data line.

2. The data transfer control circuit according to claim 1, wherein said multiplexer circuit comprises a transfer gate.

3. The data transfer control circuit according to claim 1, wherein said equalizer circuit restores said second data line to a reset state at a timing determined by said equalizer circuit in non-synchronism with an external signal after a lapse of a predetermined time from when the reset state of said second data line is temporarily released.

4. The data transfer control circuit according to claim 3, wherein said multiplexer circuit comprises a transfer gate.

5. A data transfer control circuit comprising:
    a data transfer circuit selectively connecting a plurality of first data line pairs to a second data line pair to transfer data signals input to said first data line pairs to said second data line pair;
    an equalizer circuit arranged on said second data line pair and configured to maintain said second data line pair at a reset state in a stable condition and temporarily release the reset state of said second data line pair in synchronism with transition of data input from said first data line pairs; and
    a data latch circuit arranged on said second data line pair and configured to latch a data signal transferred through said data transfer circuit and in synchronism with transition of data from said first data line pairs, and wherein
    said data transfer circuit comprises a multiplexer circuit configured to lead data of a data line pair selected from said plurality of first data line pairs to said second data line pair.

6. The data transfer control circuit according to claim 5, wherein said equalizer circuit restores said second data line pair to a reset state at a timing determined by said equalizer circuit in non-synchronism with an external signal after a lapse of a predetermined time from when the reset state of said second data line pair is temporarily released.

7. The data transfer control circuit according to claim 6, wherein said multiplexer circuit comprises a transfer gate.

8. The data transfer control circuit according to claim 5, wherein said multiplexer circuit comprises a transfer gate.

9. A dynamic type semiconductor memory device comprising:

- a memory cell array including a plurality of bit lines and a plurality of word lines crossing one another and a plurality of dynamic memory cells arranged at cross points of said bit lines and said word lines;
- a sense amplifier configured to exchange data with a memory cell selected from said memory array;
- an address buffer configured to fetch a row address and a column address from an external;
- a column decoder arranged neighborhood of said memory cell array and configured to select said bit lines of said memory cell array in accordance with the column address from said address buffer;
- a row decoder arranged neighborhood of said memory cell array and configured to select said word lines of said memory cell array in accordance with the row address from said address buffer;
- a plurality of first data lines connected to said bit lines through transfer gates controlled selectively by said column decoder;
- a second data line connected to said first data lines;
- a data transfer circuit selectively connecting the first data lines to the second data line;
- an equalizer circuit arranged on said second data line and configured to maintain said second data line at a reset state in a stable condition and temporarily release the reset state of said second data line in synchronism with transition of data input from said first data lines, a said equalizer circuit being configured to restore said second data line to a reset state at timing determined by said equalizer circuit in non-synchronism with an external signal after a lapse of a predetermined time from when the reset state of said second data line is temporarily released; and
- a data latch circuit arranged on said second data line and configured to latch a data signal transferred through said transfer circuit and to be controlled in synchronism with transition of data from said first data lines, and wherein
- said data transfer circuit comprises a multiplexer circuit configured to lead data of a data line selected from said plurality of first data lines to said second data line.

10. The dynamic type semiconductor memory device according to claim 9, wherein said multiplexer circuit is constituted by a transfer gate.

11. A dynamic type semiconductor memory device comprising:

- a memory cell array including a plurality of bit lines and a plurality of word lines crossing one another and a plurality of dynamic memory cells arranged at cross points of said bit lines and said word lines;
- a sense amplifier configured to exchange data with a memory cell selected from said memory array;
- an address buffer configured to fetch a row address and a column address from an external;
- a column decoder arranged neighborhood of said memory cell array and configured to select said bit lines of said memory cell array in accordance with the column address from said address buffer;
- a row decoder arranged neighborhood of said memory cell array and configured to select said word lines of said memory cell array in accordance with the row address from said address buffer;
- a plurality of first data lines connected to said bit lines through transfer gates controlled selectively by said column decoder;
- a second data line connected to said first data lines;
- a data transfer circuit selectively connecting the first data lines to the second data line;
- an address transition detector circuit arranged on an output terminal of said address buffer and configured to detect transition of a column address signal;
- an equalizer circuit arranged on said second data line and configured to maintain said second data line at a reset state in a stable condition and temporarily release the reset state of said second data line in synchronism with transition of data input from said first data lines, said equalizer circuit being configured to restore said second data line to a reset state after a lapse of a predetermined time from when the reset state of said second data line is temporarily released; by means of an output of said address transition detector circuit; and
- a data latch circuit arranged on said second data lines and configured to latch a data signal transferred through said transfer circuit and to be controlled by the output of said address transition detector circuit, and wherein
- said data transfer circuit comprises a multiplexer circuit configured to lead data of a data line selected from said plurality of first data lines to said second data line.

12. The dynamic type semiconductor memory device according to claim 11, wherein said multiplexer circuit is constituted by a transfer gate.

* * * * *